US008637799B2

(12) United States Patent
Oku

(10) Patent No.: US 8,637,799 B2
(45) Date of Patent: Jan. 28, 2014

(54) IMAGING APPARATUS WITH LENS ARRAY HAVING DENSELY ARRANGED LENS SURFACES WITHOUT A GAP

(75) Inventor: Kentaro Oku, Mobara (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 331 days.

(21) Appl. No.: 13/043,570

(22) Filed: Mar. 9, 2011

(65) Prior Publication Data

US 2011/0233383 A1 Sep. 29, 2011

(30) Foreign Application Priority Data

Mar. 24, 2010 (JP) ................................. 2010-067960

(51) Int. Cl.
*H01L 27/146* (2006.01)
(52) U.S. Cl.
USPC ........ 250/208.1; 348/340; 359/363; 359/435; 359/619
(58) Field of Classification Search
USPC .......... 250/216; 359/362, 363, 434, 435, 618, 359/619, 620, 621, 622, 623, 626, 628
See application file for complete search history.

(56) References Cited

U.S. PATENT DOCUMENTS

| 5,121,254 | A | 6/1992 | Hamanaka et al. | |
|---|---|---|---|---|
| 6,995,916 | B2 * | 2/2006 | Yamanaka et al. | ............ 359/619 |
| 7,973,928 | B2 * | 7/2011 | Iwane | ........................... 356/328 |

FOREIGN PATENT DOCUMENTS

| JP | 3-157602 | 7/1991 |
|---|---|---|
| JP | 07-021373 | 1/1995 |
| JP | 2005-312749 | 11/2005 |
| JP | 2006-213009 | 8/2006 |

OTHER PUBLICATIONS

Amano, "Ultra Precision Machining Technology of Die for Molding Optical Parts," Preliminary report in 41$^{st}$ Summer Seminar (2007), Japan Society of Applied Physics.
Yoshikawa et al.,"Ultra Precision Cutting of Die for Micro Lens Array Using Diamond Cutting Tool—Study on Fast Cutting Method With Piezoelectric Actuator," Japan Society for Precision Engineering, Proceedings of Academic Lecture in the Spring Conference, 2006, pp. 1043-1044.
Yoshikawa et al., "Ultra Precision Cutting of Die for Micro Lens Array Using Diamond Cutting Tool ($3^{RD}$ Report)—Micro Patterning of High Accuracy Lens Array for Roll Die," Japan Society for Precision Engineering, Proceedings of Academic Lecture in the Spring Conference, 2007, pp. 679-680.
Ito et al.,"Application Expansion of Nanoimprint Technology—Application Example to Optical Device," Preliminary Report in 41$^{st}$ Summer Seminar (2007), Japan Society of Applied Physics.

\* cited by examiner

*Primary Examiner* — Tony Ko
(74) *Attorney, Agent, or Firm* — Antonelli, Terry, Stout & Kraus, LLP.

(57) ABSTRACT

An imaging apparatus is realized which enables a thin finger vein authentication apparatus having a thickness installable in a portable information device. A light beam emitted from an object passes through a visible light cut-off filter 20 and enters a pre-focus lens array 11. The pre-focus lens array 11 focuses the light beam on an opening of a micro aperture array 15. The light beam passed through the micro aperture array 15 diverges, but it is focused with the post-focus lens array 13 on the light detection device 30. With this structure, a thin imaging apparatus can be obtained with maintained resolution, and a finger authentication apparatus installable in a portable information device can be realized.

7 Claims, 16 Drawing Sheets

FIG. 3

LIST OF BASIC CONDITIONS

| DIMENSIONAL PARAMETER | DIMENSION, REFRACTION INDEX n, ETC. |
|---|---|
| a: DISTANCE FROM OBJECT POINT TO VISIBLE LIGHT CUT FILTER | 6 mm (typical: 5 – 7 mm), n = 1.33 (WATER) |
| b: VISIBLE LIGHT CUT FILTER THICKNESS | 2 mm, n = 1.53 (GLASS) |
| c: DISTANCE FROM VISIBLE LIGHT CUT FILTER TO PRE-STAGE LENS SUBSTRATE | 0.1 mm, n = 1 (AIR) |
| d: DISTANCE FROM PRE-STAGE LENS SUBSTRATE TO SLIT SURFACE | 0.54 mm, n = 1.5696 (BASE MATERIAL PC) |
| e: DISTANCE FROM SLIT SURFACE TO POST-STAGE SECOND LENS SUBSTRATE | 0.21 mm, n = 1.5696 (BASE MATERIAL PC) |
| f: DISTANCE FROM SECOND LENS SUBSTRATE TO SENSOR SURFACE | 0.15 mm, n = 1 (AIR) |
| LENGTH OF ONE SIDE OF PRE-STAGE LENS ( = LENS PITCH $L_p$) | 0.1 mm (SPHERICAL SURFACE : RECTANGULAR DENSE ARRANGEMENT) |
| HEIGHT OF PRE-STAGE LENS | 0.080 mm (ROTATIONALLY SYMMETRIC PARABOLOID) |
| DIAMETER OF POST-STAGE LENS | 0.080 mm (ROTATIONAL SYMMETRY PARABOLOID) |
| HEIGHT OF POST-STAGE LENS | 0.020 mm, n = 1.5696 |
| DIAMETER OF APERTURE OPENING | 0.006 – 0.012 mm |

CALCULATED VALUE OF IMAGE MAGNIFICATION (WHEN a = 6 mm) :
IMAGE MAGNIFICATION OF PRE-FOCUS LENS M1 = 0.059, IMAGE MAGNIFICATION OF POST-FOCUS LENS M2 = 0.99,
COMBINING IMAGE MAGNIFICATION M = M1 × M2 = 0.058

POST-FOCUS LENS HAS SPHERICAL SURFACE WITH HEIGHT OF 26μm

IMAGING APPARATUS WITH LENS ARRAY HAVING DENSELY ARRANGED LENS SURFACES WITHOUT A GAP

CLAIM OF PRIORITY

The present application claims priority from Japanese Patent Application JP 2010-067960 filed on Mar. 24, 2010, the content of which is hereby incorporated by reference into this application.

BACKGROUND OF THE INVENTION

The present invention relates to an imaging device applicable to mobile device information security and a finger vein authentication apparatus using the imaging device.

DESCRIPTION OF RELATED ART

In recent years, to ensure information security in mobile information devices, biometrics authentication is very important. For example, in a biometric authentication apparatus using finger vein authentication, imaging is mainly performed by projecting an image onto an image sensor with a set of optical lenses. However, in this method, downsizing and thinning of the apparatus are limited.

On the other hand, for downsizing and thinning of the apparatus to a large extent, biometrics imaging with a micro lenses corresponding to respective pixels of an image sensor is proposed. This method has a problem that a finger vein or the like cannot be resolved without blocking light at a large incident angle among light incident on the respective pixels. To realize a downsized, thin and low-price finger vein authentication apparatus, it is necessary to provide a light focusing unit and an incident angle limiting unit for the respective pixels of the image sensor, and it is significant to establish a structure and a production method for simple production.

The finger vein authentication apparatuses include an apparatus using a near infrared ray transmitted from an LED or the like and an apparatus using scattered light. Japanese Published Unexamined Patent Application No. Hei 7-21373 discloses an example of the apparatus using near infrared transmission light and Japanese Published Unexamined Patent Application No. 2005-312749 discloses an example of the apparatus using scattered light. The finger vein authentication apparatus using transmission light has a problem that the apparatus scale is larger than that of the apparatus using scattered light. For improvement in information security in mobile information devices, practical use of a small and thin type finger vein authentication apparatus using scattered light is desired.

FIG. 23 schematically shows the structure and an example of processing in a finger vein authentication apparatus using scattered light. Light emitted from a near infrared light source 105 such as an LED is scattered with biological tissues in a finger, and the scattered light is limited to a near infrared wavelength through a visible light cut-off optical filter 101 and an ultraviolet light cut-off filter 102, focused on an image sensor 104 with a set of optical lenses 103, and imaging is performed. Note that in this method, to obtain sufficient resolution and sensitivity, it is necessary to increase the diameter of the optical lens to a certain degree. This increases the distance from the external surface of the apparatus (finger contact surface) to the image sensor, and increases the thickness of the apparatus. This structure cannot be applied to a thin type portable information device without difficulty.

To solve the problem, an optical system using an image sensor, having micro lenses provided in correspondence with respective pixels of the image sensor to focus light to respective detection devices and light shielding spacers to shield light at a large incident angle at the same time, is proposed (Japanese Published Unexamined Patent Application No. 2006-213009). This optical system is disclosed in e.g. Japanese Published Unexamined Patent Application No Hei 3-157602, and the optical system is schematically shown in FIG. 24. FIG. 24 reproduces FIG. 1 in Japanese Published Unexamined Patent Application No. Hei 3-157602. By adopting a combination of a micro lens array 202 and an array of elongated fine openings of cylinder, it is possible to realize a biometric authentication two-dimensional image sensor (area sensor) in principle. Note that in FIG. 24, reference numeral 201 denotes a lens array plate; 203, a light shielding spacer; 204 denotes black coating material (light absorbing surface); and 205 denotes a light detection device.

However, the optical system using the plate of array of elongated fine openings of cylinder (light shielding plate with micro hole array) is proposed on the premise of use in a one-dimensional image sensor 206 (line sensor) for facsimile transmission, and the specification merely describes, in the manufacturing method, the manufacture of the one-dimensional image sensor. It is difficult to manufacture two-dimensional image sensors as industrial products with this manufacturing method. Even when a light shielding plate with micro hole array is manufactured by forming a mold with reversed micro hole array and by performing injection mold using UV curing resin or the like, it is difficult to pull out a precipitous micro hole array from a metal mold, i.e., mold release is difficult.

SUMMARY OF THE INVENTION

The present invention has been made in consideration of the above situation, and realizes a structure and manufacturing method of an imaging device which enables a thin and small finger vein authentication system.

To solve the above problem, the inventor has made an optical system, which can be released from a mold without difficulty and can be comparatively simply manufactured, and which has a focusing effect of light from an object and a shielding effect for large incident angle light. The subject matter of the present invention is to provide a pre-focus micro lens array and an aperture array oppositely to each other, provide an aperture of the aperture array in the vicinity of the first focus of the light from the object by the pre-focus micro lens array, and to perform the secondary light focusing with a post-focus micro lens array at the same time. The large incident angle light to the image sensor is shielded with the pre-focus micro lens array and the aperture array, therefore only small incident angle light necessary for image detection is focused on a small light detection device.

According to the present invention, it is possible to attain a very small diameter of the micro lens corresponding to each pixel of the image sensor, and a compact light shielding unit. It is possible to downsize the optical system used in a finger vein authentication apparatus therefore to realize a downsized and thin finger vein authentication apparatus.

Further, the present invention facilitates installation of the finger vein authentication apparatus in cellular phones and mobile PCs, and contributes to improvement in information security in mobile information devices.

BRIEF DESCRIPTION OF THE DRAWINGS

FIG. 3 is a table describing parameters for optical designing;

DETAILED DESCRIPTION OF THE PREFERRED EMBODIMENTS

Next, preferred embodiments of the present invention will now be described in detail in accordance with the accompanying drawings.

First Embodiment

Figure 1:
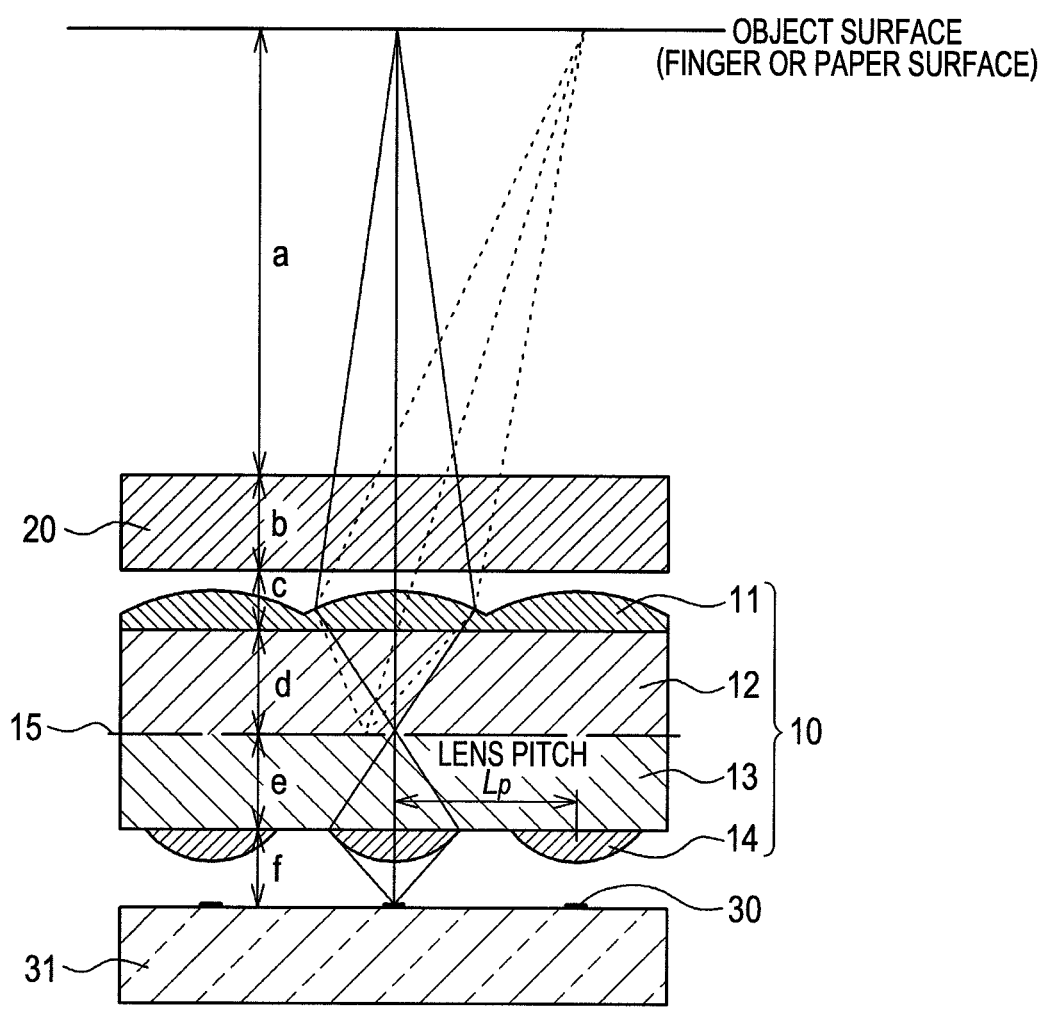
FIG. 1 is a schematic cross-sectional view of an imaging apparatus according to the present invention.
Figure 23:
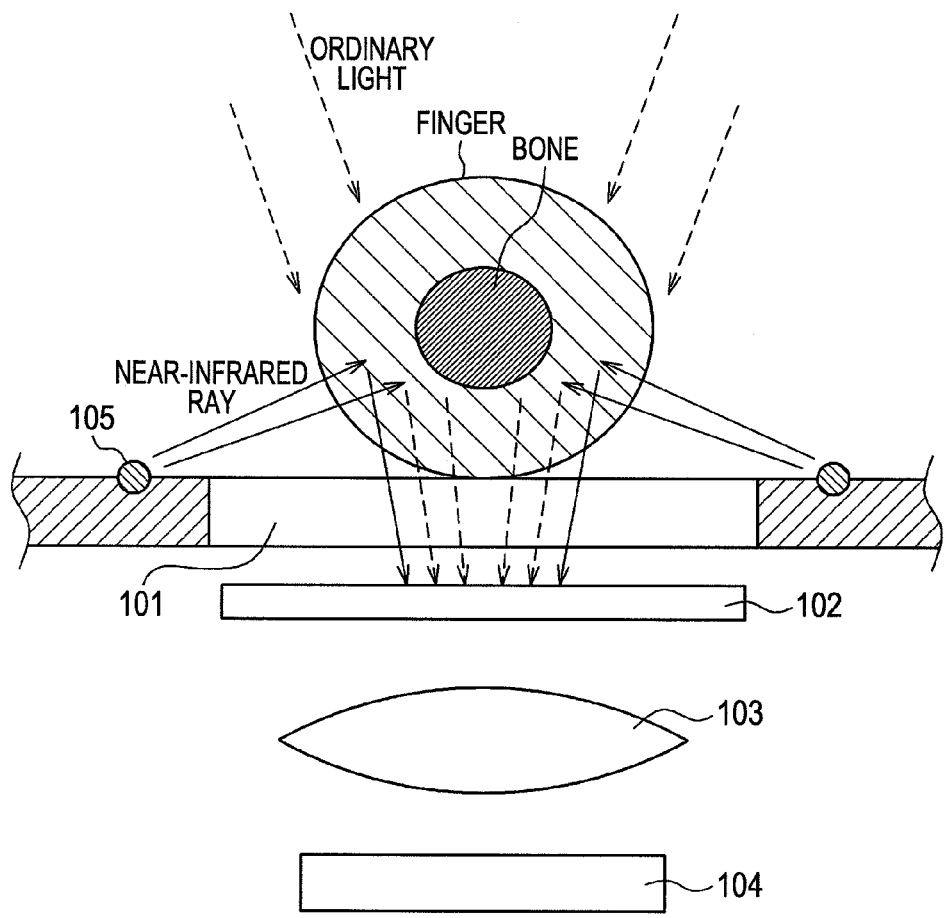
FIG. 23 is a schematic cross-sectional view of a finger authentication system in a conventional technique.
Figure 24:
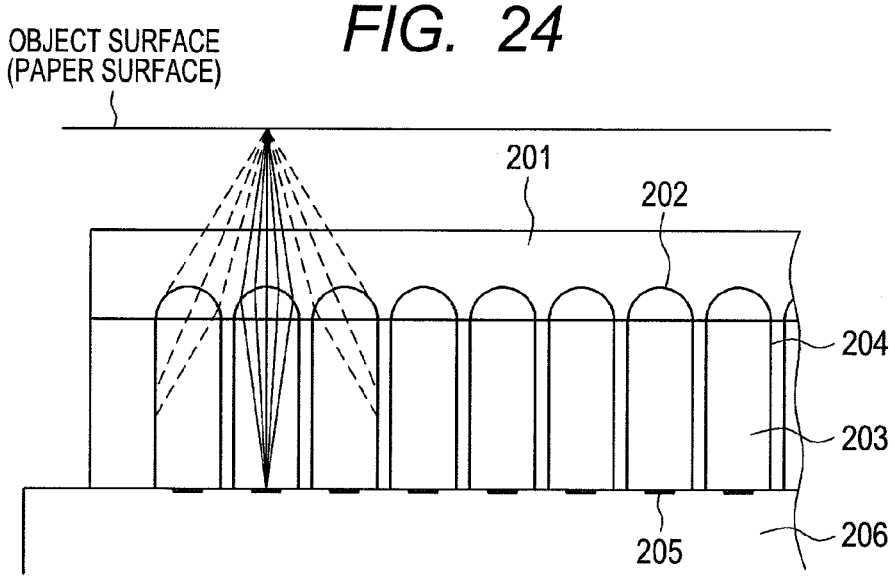
FIG. 24 is a cross-sectional view showing a possibility of application of a thinned optical system in the conventional technique to the finger authentication system.

FIG. 1 schematically shows a first embodiment of the present invention and its principle. Note that although not shown in FIG. 1, when the imaging apparatus is used as a finger vein authentication apparatus as in the case of FIG. 23, a light source such as an LED to emit a near infrared ray from the image sensor side toward a finger is required. The light scattered in the finger is utilized for finger vein authentication. It is considered that the object surface in the case of the imaging apparatus in FIG. 1 is biological tissues in the finger, that in the case of a finger print authentication apparatus is a finger surface, and that in the case of a facsimile machine is a paper surface.

The near infrared ray and ordinary light (extraneous light) scattered from the object surface arrive at a light focusing/shielding array plate 10 through a visible light cut-off filter 20 having a thickness b provided away by distance a and an air layer. The light focusing/shielding array plate 10 has a pre-focus lens array 11, a pre-focus lens substrate 12, an aperture array 15, a post-focus lens substrate 13 and a post-focus lens array 14. A light detection device 30 formed on a glass substrate 31 is provided oppositely to the post-focus lens array 14.

The main dimensional parameters in designing are measurements a to f and refractive indices of respective members. The light focusing/shielding array plate is designed to obtain a light beam emitted from one point of an object surface to have a circle of least confusion (i.e. to have a minimum diameter of the light beam) in the vicinity of the aperture. The light at a small emission angle, emitted from an object point extended from an optical axis indicated with a solid line, is focused in the vicinity of the aperture to have a small diameter and passes through an aperture opening. However, light emitted from a point decentered from the optical axis indicated with a broken line is not passed within the opening since it is decentered in the vicinity of the aperture.

In consideration of the above situation, it is apparent that even when the object surface exists somewhat away from the image sensor, each light detection device 30 can detect a change in luminance with respect to the positional change by about a sensor pixel pitch within the object surface, and accordingly, a read image has a resolution corresponding to the pixel pitch of the image sensor. In the present invention, the combination of the pre-focus lens and aperture is arrayed in a micro array, and a micro lens array is provided in the post stage. The once-scattered light beam is focused on the small light detection device, so that a sufficient illumination light amount is obtained.

Note that in the image sensor, the pixel pitch is about 0.1 mm which is larger in comparison with an ordinary CMOS or CCD image sensor. Generally, the light detection device of an image sensor can be regarded as a capacitor where a photoconductive film is held between a transparent electrode and a metal electrode. As a result, when the area of the light detection device is increased, the parallel stray capacitance connected to the first preamplifier is also increased, and the sensor S/N ratio is degraded and the sensitivity is lowered. Accordingly, it is significant to ensure S/N ratio and sensitivity by reducing the size and the stray capacitance of the light detection device 30. On the other hand, when the light detection device 30 is downsized, as a sufficient illumination light amount cannot be ensured with the same illumination intensity, the small light detection device 30 is provided with the post-focus lens array so as to focus the light passed through the aperture opening to ensure a sufficient illumination light amount.

Figure 2:
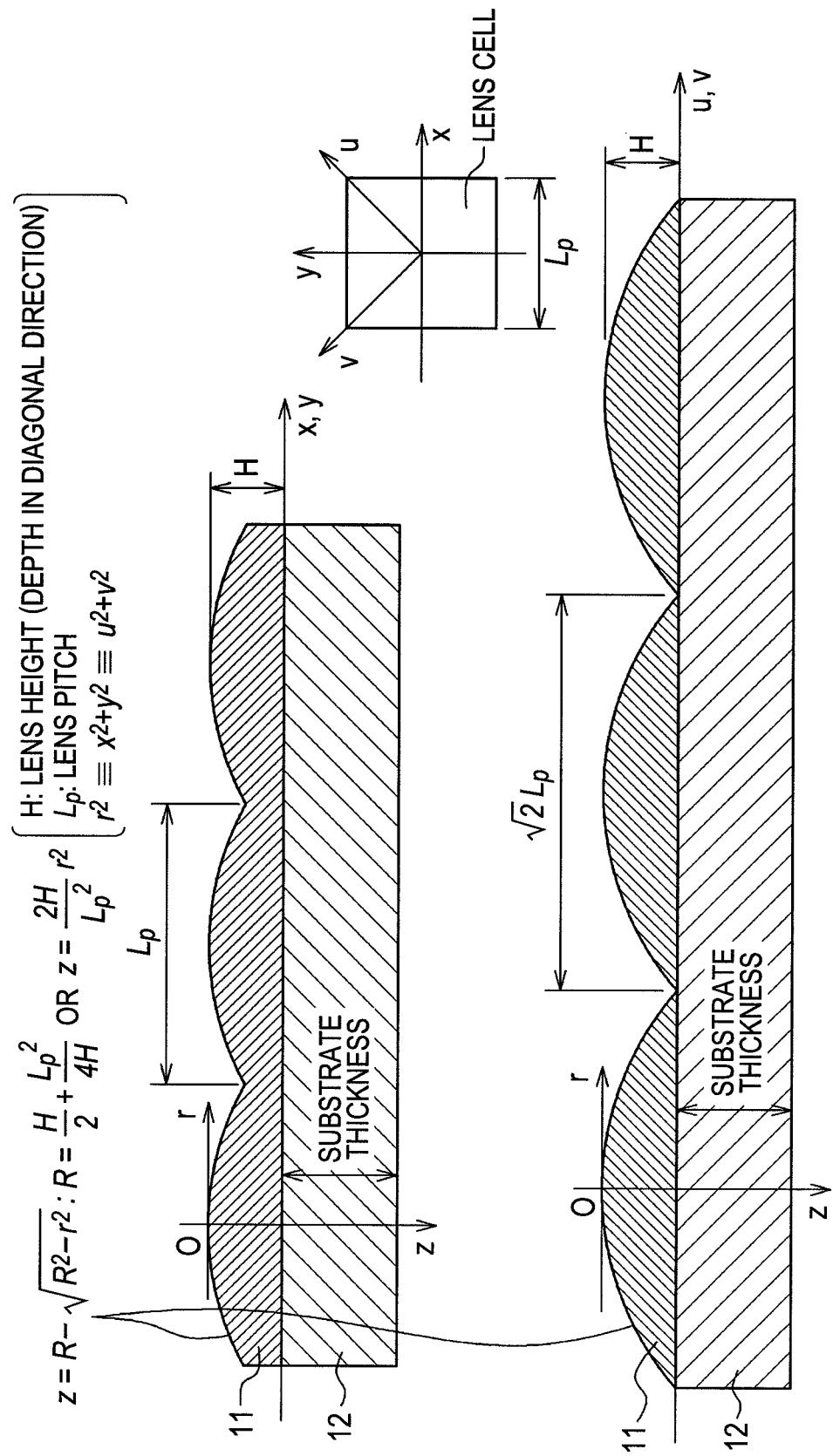
FIG. 2 is a cross-sectional view of a pre-focus lens array.

FIG. 2 shows a horizontal or vertical cross-section and a pixel-diagonal cross-section of a fly eye lens array used as the pre-focus lens array. The lens surface of the fly eye lens array is not necessarily spherical but may be a rotational symmetric parabolic surface. Note that in the pre-focus lens array, it is important that the lens surfaces are densely arrayed without any gap so as not to expose a flat part of the substrate. The dense lens array can realize the effect of the shielding of light beam at a large incident angle to the full extent. When a flat part without lens curve is exposed, a light beam slantingly incident on the flat part directly enters the aperture opening without lens effect, illuminates any part of the light detection device as stray light, to cause degradation of resolution or contrast ratio of the pickup images.

Note that in a dense rectangular lens array as shown in FIG. 2, the elevational difference in a u-z or v-z cross section of a diagonal direction u or v is greater than that in a x-z or y-z cross section of a horizontal or vertical direction x or y. When the lens array is formed using a metal mold and UV curing resin on a flat plate substrate, four points at opposing corners are contact points of the lens array metal mold and the lens substrate. Accordingly, when a lens height H is defined, the height from the points at the deepest opposing corners of the lens array to the vertex is used.

The conceptual explanation of the idea of the light focusing/shielding array plate according to the present invention is described as above. Hereinbelow, a particular example of a designed optical system will be described. The optical system is designed on the assumption that the image sensor has a rectangular array measuring 0.1 mm per side and the light detection device of the sensor is a rectangular device measuring 0.01 mm per side.

FIG. 3 shows the basic design specification of the optical system including e.g. respective measurements and refractive indices. The post-focus lens has a rotational symmetric parabolic surface with a diameter of 0.08 mm. As a lens diameter D is smaller than a lens pitch $L_P$, the border line of the post-focus lens is circular, and the circular shapes are arranged at equal intervals in horizontal and vertical directions as a lens array. In the post-focus lens array, it is also desirable that a flat part between lenses is as small as possible. However, as the shielding function works even with a few small flat parts, it is not necessary that the lens surfaces are densely arrayed without gap in the post-focus lens array.

Figure 4:
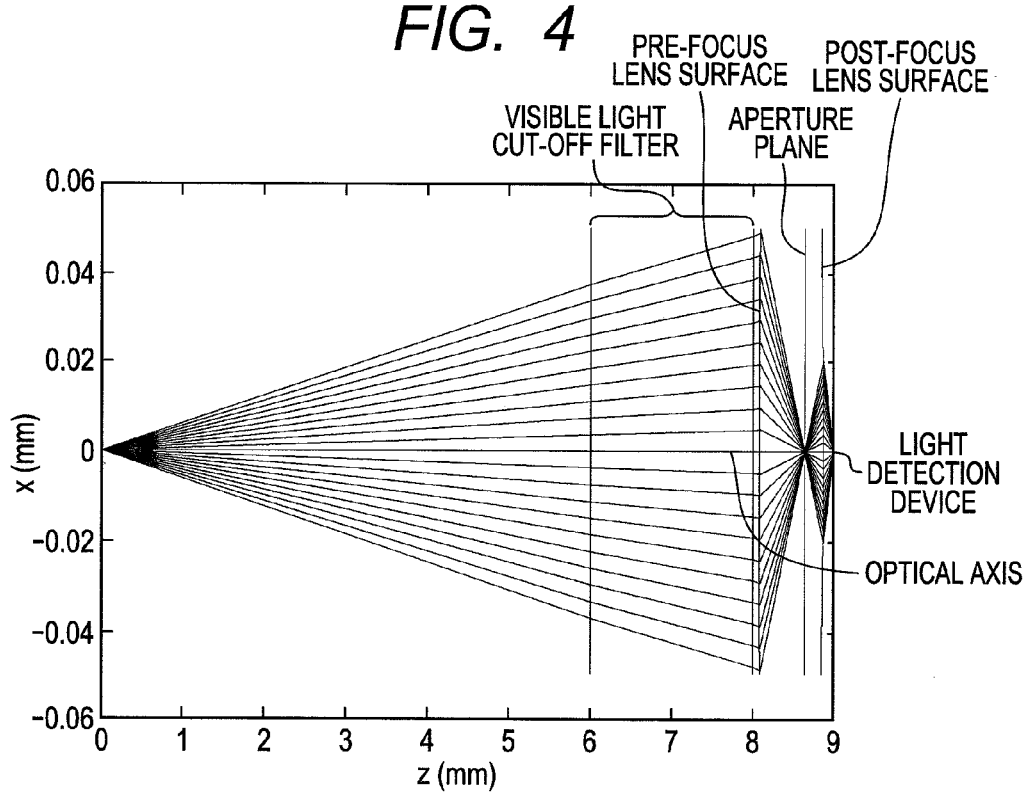
FIG. 4 is a graph showing loci of light emitted from one point on an optical axis.

Hereinbelow, based on the basic conditions such as measurements and refractive indices in FIG. 3, the effects of the present invention will be described in more detail using optical simulations. FIG. 4 shows the relation between loci of light beam emitted from one point on an optical axis (z axis) away from the surface of the visible light cut-off filter by 6 mm as a basic condition and x-z cross sections of the respective optical surfaces. The light loci are drawn within a range of divergent angle where the light rays are incident on an opposing pre-focus lens. As a finger vein authentication image sensor, on the assumption that a vein in a position away from the visible light cut-off filter as a contact surface by 5 to 7 mm is read, the basic distance from the light emission point to the surface of the visible light cut-off filter is 6 mm.

Note that in FIG. 4, as the drawing expansion scale in the x direction is very larger than that in the z direction, the lens surface hardly looks like a curved surface. However, it is actually a curved surface. It is understood from this figure that a light beam emitted from one point is focused in the vicinity of the aperture plane by the effect of the pre-focus lens, then all the light beam passes through the aperture opening having a diameter of 6 μm, then the light beam again diverges from the focus point in the vicinity of the aperture, and is again focused by the effect of the post-focus lens to the center of the light detection device.

Figure 5:
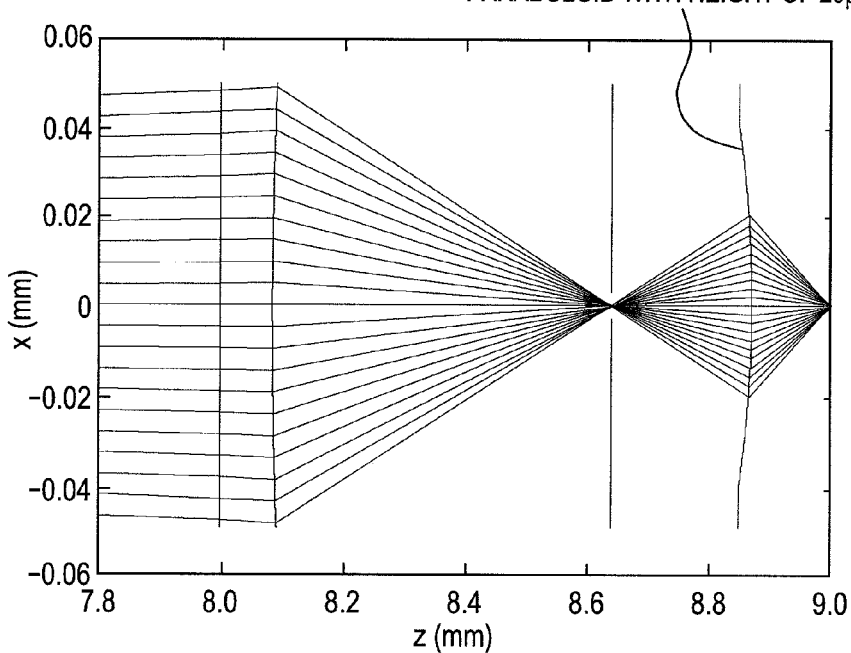
FIG. 5 is a graph showing loci of light between a pre-focus spherical lens and a post-focus aspherical lens.
Figure 6:
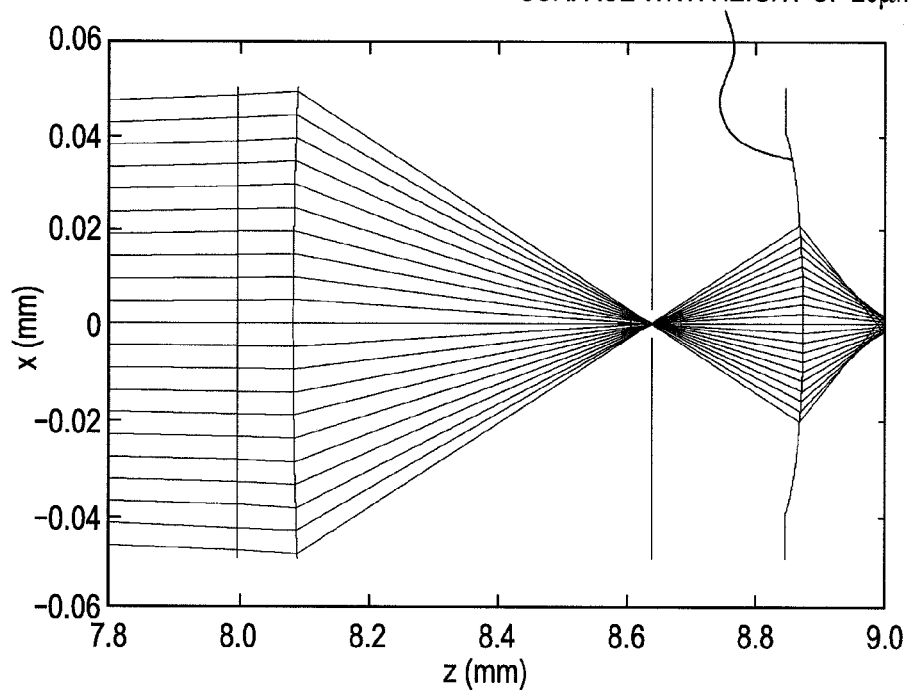
FIG. 6 is a graph showing loci of light between a pre-focus spherical lens and a post-focus spherical lens.

FIG. 5 shows loci of light in the vicinity of the light focusing/shielding array plate and the light detection device when the pre-focus lens is a spherical lens and the post-focus is a rotational symmetric parabolic surface lens (aspherical lens) as a basic condition. FIG. 6 shows loci of light in the vicinity of the light focusing/shielding array plate and the light detection device when the pre-focus and post-focus lenses are spherical lenses. In both examples, the height of the post-focus lens is adjusted such that the circle of least confusion is positioned on the light detection device. In the case of FIG. 5, the spherical aberration in a double focusing lens system is small and the light beam is focused on approximately one point on the light detection device. However, in the case of FIG. 6, as the spherical aberration in the double focusing lens system is large, the light beam is widely diverged on the light detection device. That is, when the pre-focus lens is a spherical lens and the post-focus lens is a rotationally symmetric parabolic surface lens (aspherical lens), the spherical aberration in a double focusing lens system is smaller in comparison with that when the pre-focus and post-focus lenses are spherical lenses, and the former double focusing lens system is optically superior.

Figure 7:
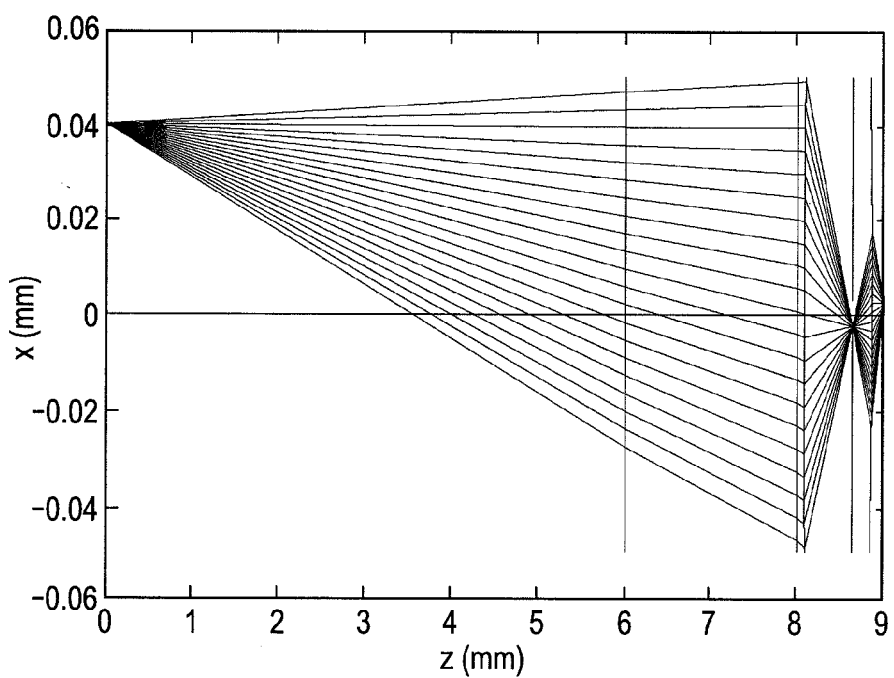
FIG. 7 is a graph showing loci of light emitted from a point shifted from the optical axis by 0.04 mm.
Figure 8:
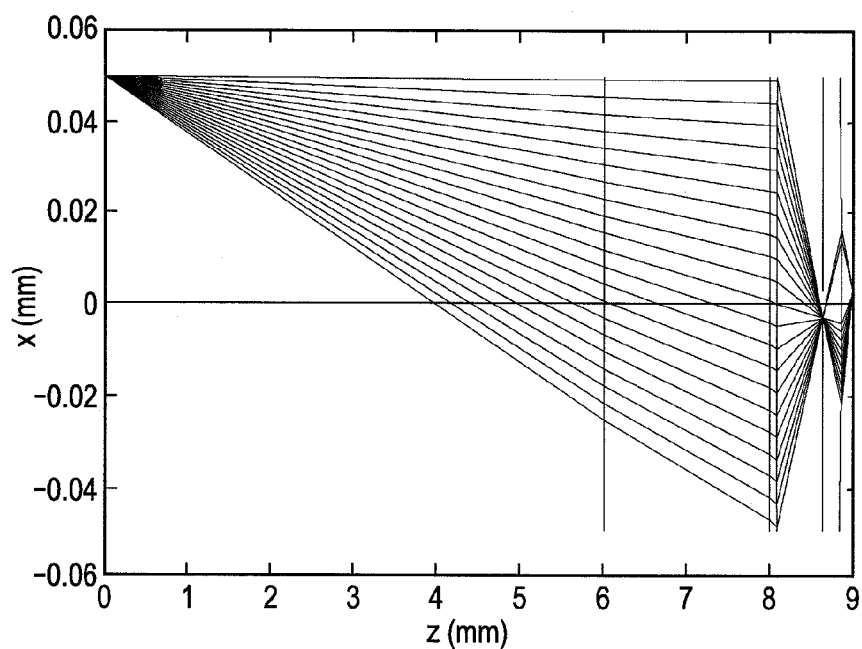
FIG. 8 is a graph showing loci of light emitted from a point shifted from the optical axis by 0.05 mm.
Figure 9:
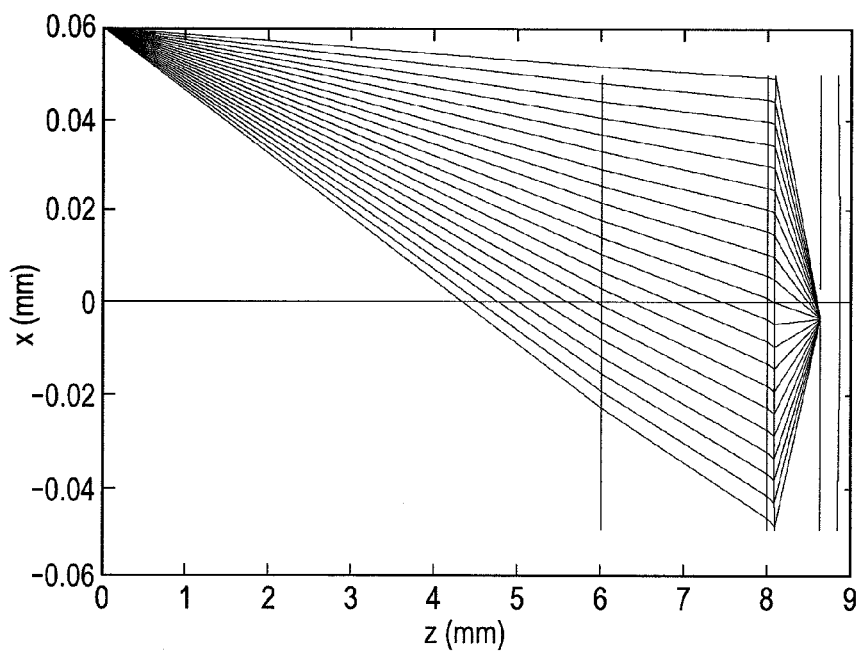
FIG. 9 is a graph showing loci of light emitted from a point shifted from the optical axis by 0.06 mm.

FIGS. 7 to 9 show loci of light when the light emission point is decentered by 40, 50 and 60 μm in the x direction. When the decentering of emission point in FIG. 7 is 40 μm, the light beam toward the lens surface is focused in the vicinity of the aperture opening and decentered from the optical axis. However, all the light beam passes through the aperture, and although it diverges in the vicinity of the aperture, it is again focused by the effect of the post-focus lens on the light detection device.

Note that as described in FIG. 3, image magnification $M_1$ of the pre-focus lens is 0.059, image magnification $M_2$ of the post-focus lens is 0.99, and as the total image magnification of the double focusing lens system, $M=M_1 \times M_2=0.058$ holds. With this image magnification, in the vicinity of a first focus point, i.e., the aperture plane, the 40 μm decentering is reduced to 40×0.059=2.4 μm, which is smaller than the radius of the aperture opening, 3 μm. That is, all the light beam passes through the aperture opening.

Further, as the image magnification of the post-focus lens is approximately 1, the 2.4 μm decentering in the vicinity of the aperture plane is held on the light detection device. That is, the light passed through the aperture diverges, but is focused on the light detection device about 10 μm per side by the effect of the post-focus lens. That is, the small incident angle light including finger vein image information is effectively utilized.

In FIG. 8, when the decentering of the emission point is the half of the lens pitch, i.e., 50 μm, the decentering on the aperture plane, 50×0.059=3.0 μm, which is equal to the radius of the aperture opening. It is therefore understood that a part of the light beam is absorbed with the aperture and the remaining light beam is focused on the light detection device.

In FIG. 9, when the decentering of the emission point is greater than the half of the lens pitch, 60 μm, the decentering on the aperture plane, 60×0.059=3.5 μm, which is greater than the radius of the aperture opening. It is therefore understood that all the light beam is absorbed with the $\Rightarrow$ stop around the aperture. That is, the light beam from the point decentered from each lens optical axis by about the half or more of the lens pitch is absorbed with the stop around the aperture and does not arrive at the light detection device without difficulty.

As described above, even when a light emission point is away from the surface of the visible light cut-off filter by 6 mm, only light in an object surface position in the vicinity of the optical axis of each micro lens arrives at the light detection device. In the light focusing/shielding array plate according to the present invention, the resolution of the image sensor is ensured.

Figure 10:
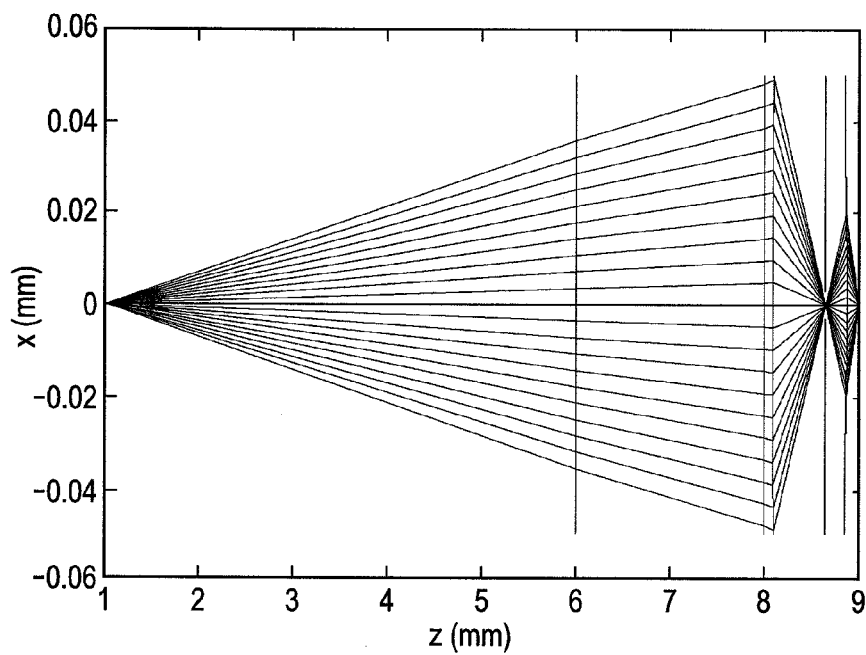
FIG. 10 is a graph showing loci of light when the distance from a visible light cut-off filter in FIG. 1 to the light emission point is shortened by 1 mm and the light emission point is on the optical axis.
Figure 11:
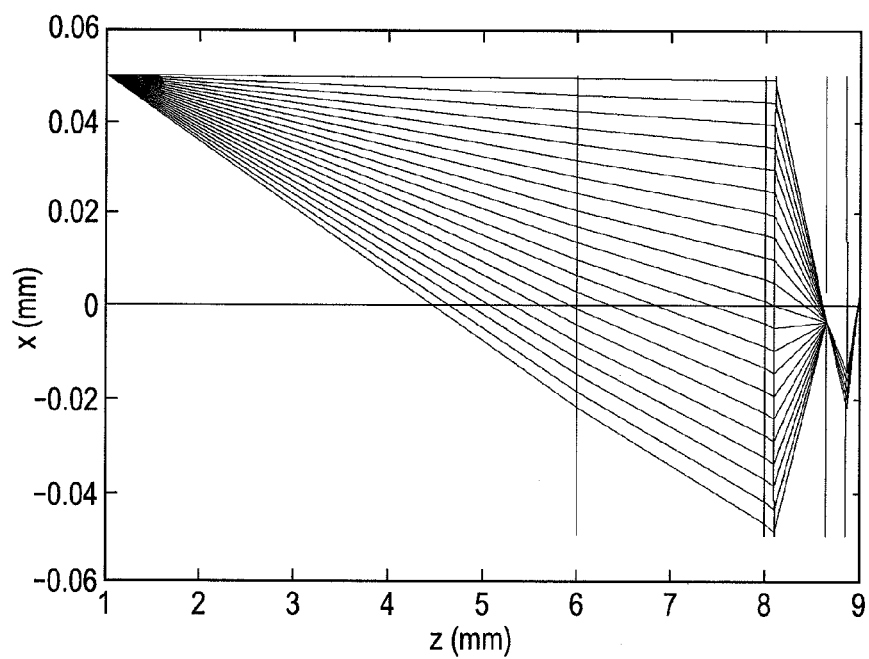
FIG. 11 is a graph showing loci of light when the distance from the visible light cut-off filter in FIG. 1 to the light emission point is shortened by 1 mm and the light emission point is shifted from the optical axis by 0.05 mm.
Figure 12:
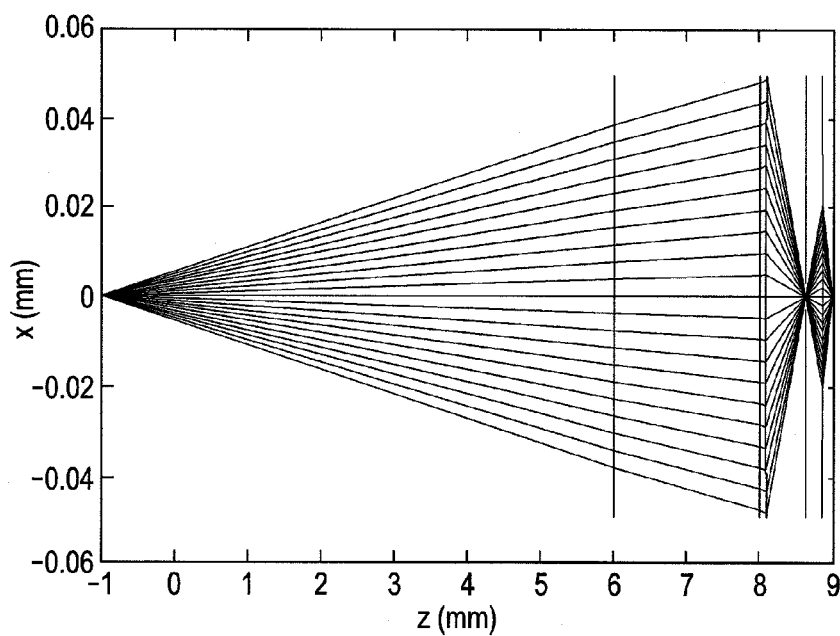
FIG. 12 is a graph showing loci of light when the distance from the visible light cut-off filter in FIG. 1 to the light emission point is increased by 1 mm and the light emission point is on the optical axis.
Figure 13:
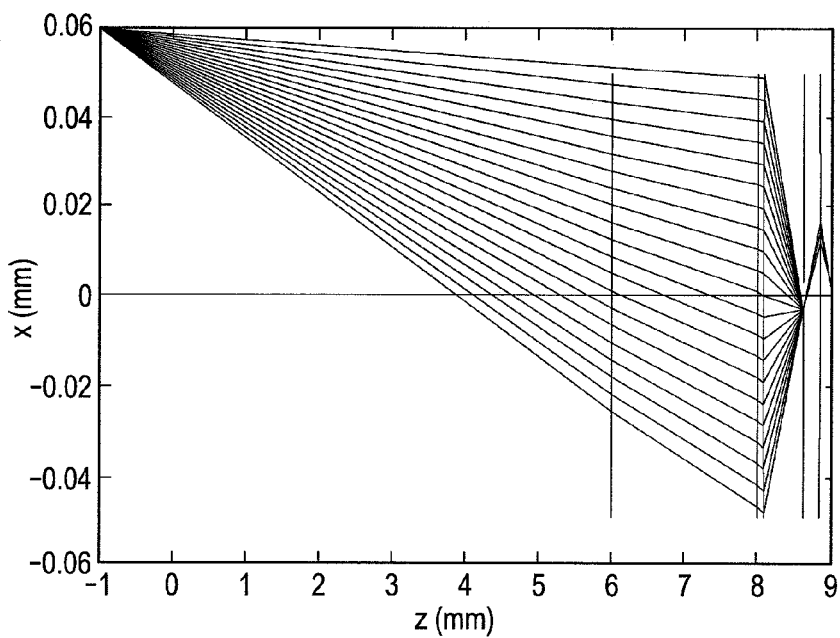
FIG. 13 is a graph showing loci of light when the distance from the visible light cut-off filter in FIG. 1 to the light emission point is increased by 1 mm and the light emission point is shifted from the optical axis by 0.06 mm.

FIGS. 10 to 13 show loci of light when the distance from the surface of the visible light cut-off filter to the light emission point is reduced by 1 mm or increased by 1 mm. FIGS. 10 and 12 show examples without decentering of the emission point while FIGS. 11 and 13 show examples with decentering of the emission point. It is understood that as the distance from the surface of the visible light cut-off filter to the light emission point is increased, the light beam is cut with the stop around the aperture due to the greater decentering amount. However, it is understood that even when the light emission position is somewhat changed in the optical axis direction, the light focusing/shielding array plate according to the present invention effectively functions. Accordingly, in the biometric authentication apparatus using the present invention, authentication can be performed with respect to a living body with a deep depth of field and some thickness. The principle of the light focusing/shielding array plate according to the present invention is as described above.

Next, the manufacturing method of the light focusing/shielding array plate will be described mainly about (1) lens array metal-mold manufacture and (2) alignment of the lens array with aperture array. As shown in FIG. 3, the lens substrate has a polycarbonate (refractive index: 1.5696) sheet, on which UV curing resin having approximately the same refractive index is held between metal molds and is set by irradiation with UV light, and released from the metal molds, thus a lens surface is formed. Two lens array plates are previously formed using pre-focus and post-focus lens substrates, and a aperture array is formed on the pre-focus lens substrate, then the two lens array plates are attached, and thereby the light focusing/shielding array plate is formed.

As the above-described metal mold manufacturing for the micro lens array of (1), briefly two types of methods are known. One method is diamond bite cutting using a piezo actuator (vibrator using a piezo device) and the other method is exposure (photolithography) used in a semiconductor process. The respective metal mold manufacturing methods are disclosed in the "Amano, Akira "Ultra Precision Machining Technology of Die for Molding Optical Parts", preliminary report in 41th Summer Seminar (2007), presented by Japan Society of Applied Physics and Optical Society of Japan", "Yoshikawa, Takehisa et al., "Ultra Precision Cutting of Die for Micro Lens Array using Diamond Cutting Tool—Study on Fast Cutting Method with Piezoelectric Actuator", Japan Society for Precision Engineering, Proceedings of Academic Lecture in the Spring Conference 2006, pp. 1043-1044", "Yoshikawa, Takehisa et al., "Ultra Precision Cutting of Die for Micro Lens Array using Diamond Cutting Tool (3rd Report)—Micro Patterning of High Accuracy Lens Array for Roll Die", Japan Society for Precision Engineering, Proceedings of Academic Lecture in the Spring Conference 2007, pp. 679-680 and "Ito, Yoshinori "Application Expansion of Nanoimprint Technology—Application example to Optical Device", preliminary report in 41th Summer Seminar (2007), presented by Japan Society of Applied Physics and Optical Society of Japan", and the lens array can be manufactured using the known manufacturing method.

Figure 14:
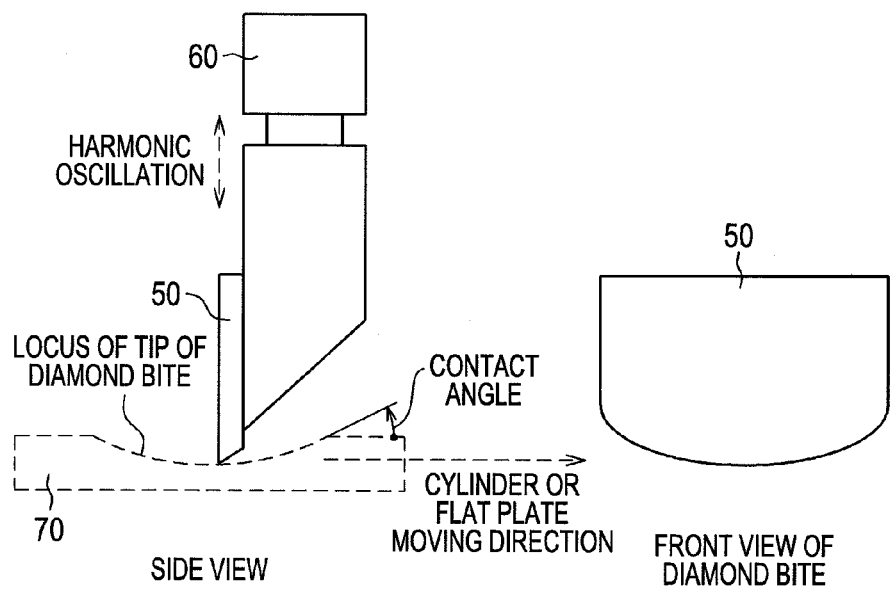
FIG. 14 is an explanatory view of a cutting method of metal molds for micro lens array.
Figure 15:
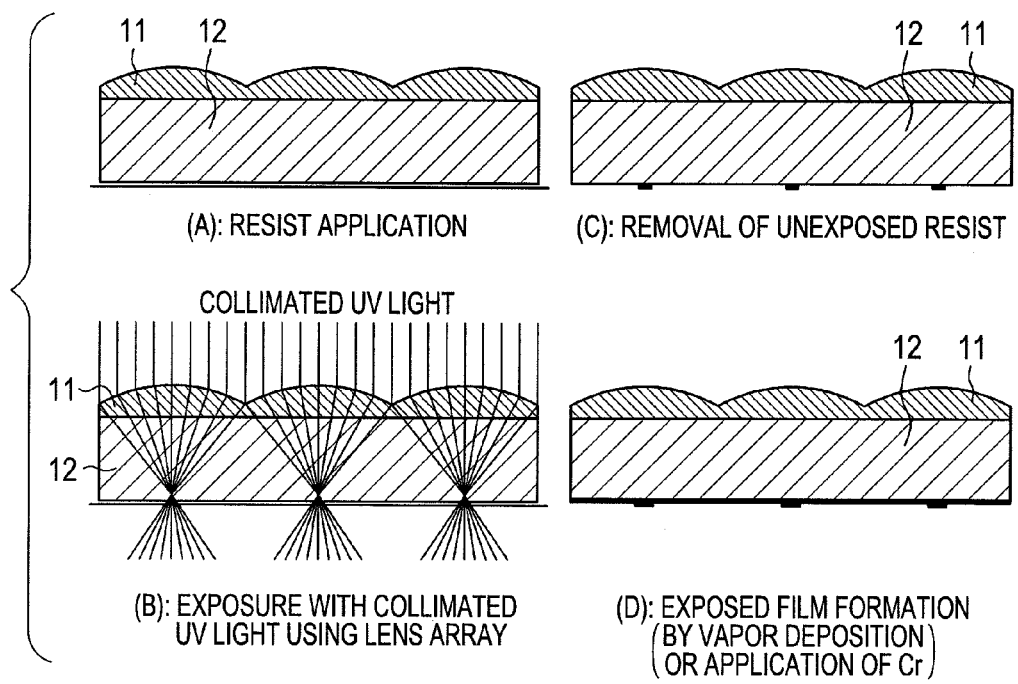
FIGS. 15A to 15D are explanatory views showing a pre-stage flow of a light focusing/shielding device manufacturing method.

In the micro lens array metal-mold cutting process with a diamond bite 50 using a piezo actuator 60, as shown in FIG. 14, when a cylindrical or flat-plate copper 70 has a cylindrical shape, the copper is cut with the diamond bite 50 attached to the end of the vertically oscillating piezo actuator 60 while it is rotated, otherwise, when the cylindrical or flat-plate copper 70 has a flat plate shape, the copper is cut with the diamond bite 50 attached to the end of the piezo actuator 60 while a work on which the flat plate is fixed is parallel translated, thereby a lens array metal mold original plate is obtained. This original plate is nickel-plated as a metal mold. As the diamond bite 50 has a certain thickness, some clearance is required between the diamond bite 50 and the cut surface. It is known that diamond bite cutting process using a piezo actuator 60 cannot be performed without difficulty as long as a contact angle with respect to the copper plate or copper cylinder 70 is equal to or smaller than 25°.

Assuming that the distance from the lens center is r, and the distance in the lens optical axis direction is z, the lens curved surface in the case of rectangular dense lens array is represented with (Expression 1) when the lens is a spherical lens.

[Expression 1]

$$z = R - \sqrt{R^2 - r^2} : R = \frac{H}{2} + \frac{L_p^2}{4H} \quad (1)$$

When the lens is a rotationally symmetric parabolic surface lens, the lens curved surface is represented with (Expression 2).

[Expression 2]

$$z = \frac{2H}{L_p^2} r^2 \quad (2)$$

Accordingly, the tangent of the contact angle θ of the diamond bite is represented with (Expression 3) when the lens has a spherical lens surface in a rectangular dense lens array.

[Expression 3]

$$\tan\theta = \frac{dz}{dr}\bigg|_{r=L_p/\sqrt{2}} = \frac{r}{\sqrt{R^2-r^2}}\bigg|_{r=L_p/\sqrt{2}} = \frac{L_p/\sqrt{2}}{\sqrt{\left(\frac{H}{2}+\frac{L_p^2}{4H}\right)^2}} = \frac{2\sqrt{2H}}{\left|1-2\left(\frac{H}{L_p}\right)^2\right|L_p} \quad (3)$$

When the lens is a rotational symmetric parabolic surface lens, the lens curved surface is represented with (Expression 4).

[Expression 4]

$$\tan\theta = \frac{dz}{dr}\bigg|_{r=L_p/\sqrt{2}} = \frac{4H}{L_p}r\bigg|_{r=L_p/\sqrt{2}} = \frac{2\sqrt{2H}}{L_p} \quad (4)$$

When $L_P=100$ μm and $H=13.5$ μm are substituted into the Expression 3 and the Expression 4, the contact angle θ is 22° when the lens has a spherical surface, and 21° when the lens has a rotational symmetric parabolic surface. That is, regardless of lens surface (spherical surface or rotational symmetric parabolic surface), the contact angle θ of the pre-focus lens metal mold is equal to or smaller than 25°. Accordingly, the metal mold original plate can be manufactured by diamond bite cutting process using a piezo actuator.

On the other hand, the post-focus lens is not arranged in a rectangular dense array, the lens diameter D is smaller than the lens pitch $L_P$, and the lens curved surface when it is spherical is represented with (Expression 5).

[Expression 5]

$$z = R - \sqrt{R^2 - r^2} \; : \; R = \frac{H}{2} + \frac{D^2}{8H} \quad (5)$$

When the lens is a rotational symmetric parabolic surface lens, the lens curved surface is represented with (Expression 6).

[Expression 6]

$$z = \frac{4H}{D^2} r^2 \quad (6)$$

In this case, the tangent of the contact angle θ of the diamond bite is represented with (Expression 7).

[Expression 7]

$$\tan\theta = \left.\frac{dz}{dr}\right|_{r=D/2} = \left.\frac{r}{\sqrt{R^2 - r^2}}\right|_{r=D/2} = \frac{D/2}{\sqrt{\left(\frac{H}{2} + \frac{D^2}{8H}\right)^2 - \frac{D^2}{4}}} = \frac{4H}{\left|1 - 4\left(\frac{H}{D}\right)^2\right| D} \quad (7)$$

When the lens is a rotational symmetric parabolic surface lens, the tangent of the contact angle θ of the diamond bite is represented with (Expression 8).

[Expression 8]

$$\tan\theta = \left.\frac{dz}{dr}\right|_{r=D/2} = \left.\frac{8H}{D^2}\right|_{r=D/2} = \frac{4H}{D} \quad (8)$$

When D=80 μm and H=20 μm are substituted into the Expression 7 and the Expression 8, the contact angle θ is 50° when the lens is a spherical surface lens, and 45° when the lens is a rotational symmetric parabolic surface lens. As the contact angle θ is equal to or greater than 25°, regarding the post-focus lens array, metal mold manufacturing by cutting process is difficult regardless of the lens surface (spherical surface or rotational symmetric parabolic surface).

In this case, the metal mold for the post-focus lens array is manufactured by exposure used in a semiconductor process. With the photolithography, an original plate for rotational symmetric parabolic surface lens array is formed by forming resin dots and melting them by heat. When an electroformed mold is formed by using this mold, the post-focus micro lens array metal mold can be formed. Further, in the combination of the pre-focus spherical lens and the post-focus rotationally symmetric parabolic lens (aspherical lens), the spherical aberration in the double focusing lens system is noticeably reduced in comparison with the combination of spherical surface lenses.

The problem of precise alignment and overlaying of the aperture array having small openings and the micro lens array in the above-described (2) can be solved by application of the method used in exposure of a black matrix and phosphor in color brown tube. In the case of color brown tube, the black matrix and the phosphor are exposed using a shadow mask having variance in manufacturing process. Then, in the light focusing/shielding array plate, the aperture array openings are similarly exposed using the micro lens array.

Figure 16:
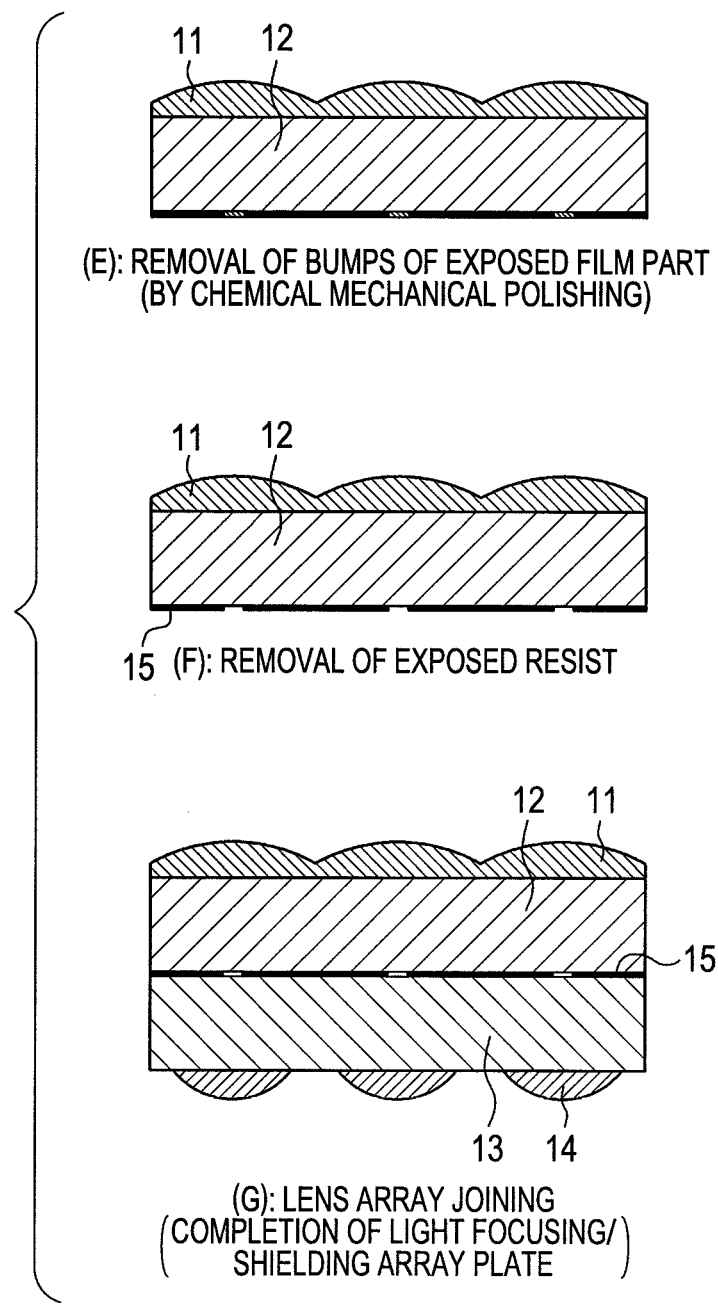
FIGS. 16E to 16G are explanatory views showing a post-stage flow of the light focusing/shielding device manufacturing method.

FIGS. 15A to 15D show a pre-stage flow of the light focusing/shielding device manufacturing method. First, the micro lens array 11 having a uniform lens height is previously formed with UV curing resin on the substrate 12 having a uniform thickness. The plate thickness of the substrate 12 is previously set such that the surface of the lens array 11 opposite to the lens forming surface on the pre-focus lens array on the substrate 12 is correspond with the aperture plane, and the process from FIG. 15A to FIG. 15D and the process from FIG. 16E to 16G are performed, thereby the light focusing/shielding array plate can be manufactured comparatively easily.

(a) A negative type photoresist film is formed on a flat surface of the pre-focus lens array 11 on the opposite side to the lens forming surface of the substrate 12.

(b) Collimated UV light is perpendicularly incident on the surface of the lens array from the lens forming surface side. The light focusing/shielding array plate is designed such that when the distance from the surface of the visible light cut-off filter to the light emission point is 6 mm, the position of the circle of least confusion of the light beam corresponds to the aperture plane position. Accordingly, when the collimated light enters, the light beam is focused in front of the aperture plane position, and the illumination distribution on the aperture plane is spread to a certain degree. The array in the opening of the aperture plane is exposed with this spread of the light beam (supplementary explanation of this arrangement will be made later).

(c) The exposed resist parts are left, and unexposed parts are removed.

(d) Cr or the like is attached to the resist surface by spattering thereby a black film is formed.

(e) The black film side of the substrate is polished by chemical mechanical polishing or the like, thereby the bumps of the exposed resist parts are unmasked and openings are formed. A micro aperture array 15 is formed with the black film and the openings.

(f) The exposed resist parts are removed (when the exposed resist parts are transparent, removal is not necessary).

(g) The two lens arrays are held via UV curing resin, then irradiated with UV diffused light, and the two lens arrays are attached thereby integrated.

The light focusing/shielding array plate manufactured in this manner is held with the glass substrate where the light detection devices are arrayed and the visible light cut-off filter plate via appropriate spacers, and attached. Thus an imaging device for biometric authentication having a visible light cut-off filter function, a light focus array for respective pixels and a light shielding array is completed with the above-described process.

Figure 17:
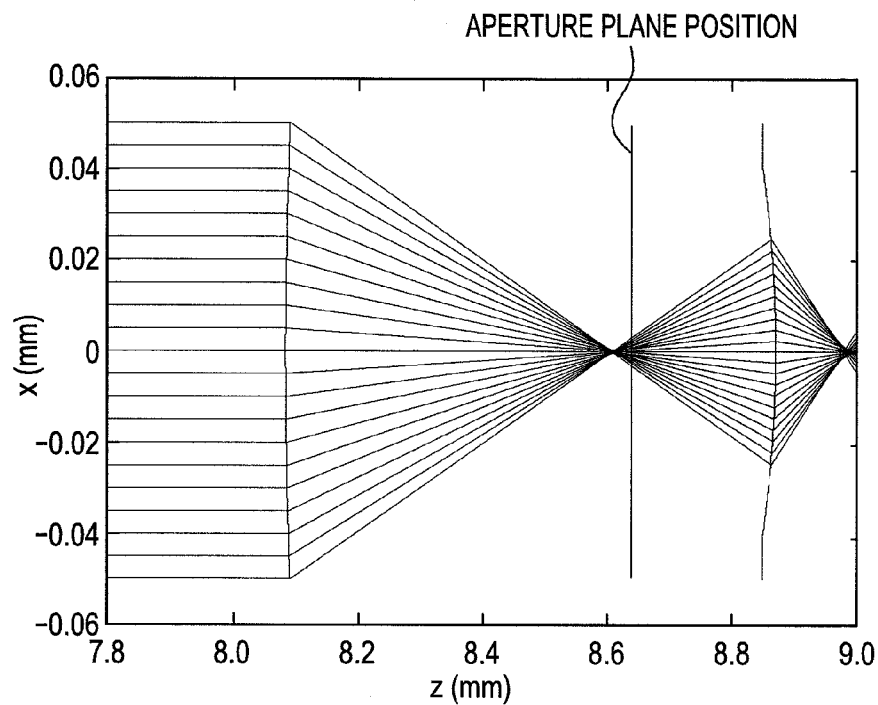
FIG. 17 is a graph showing loci of light when collimated light is incident on a lens cell.

Finally, the supplementary explanation will be made based on optical analysis described in (b). FIG. 17 shows loci of light in the vicinity of the aperture plane when a collimated light beam is incident on a lens cell. It is understood from this figure that when the collimated light beam is incident, the light beam is focused in front of the aperture plane, and as a result it spreads on the aperture plane. This spread is utilized for exposure of the aperture opening.

Figure 18:
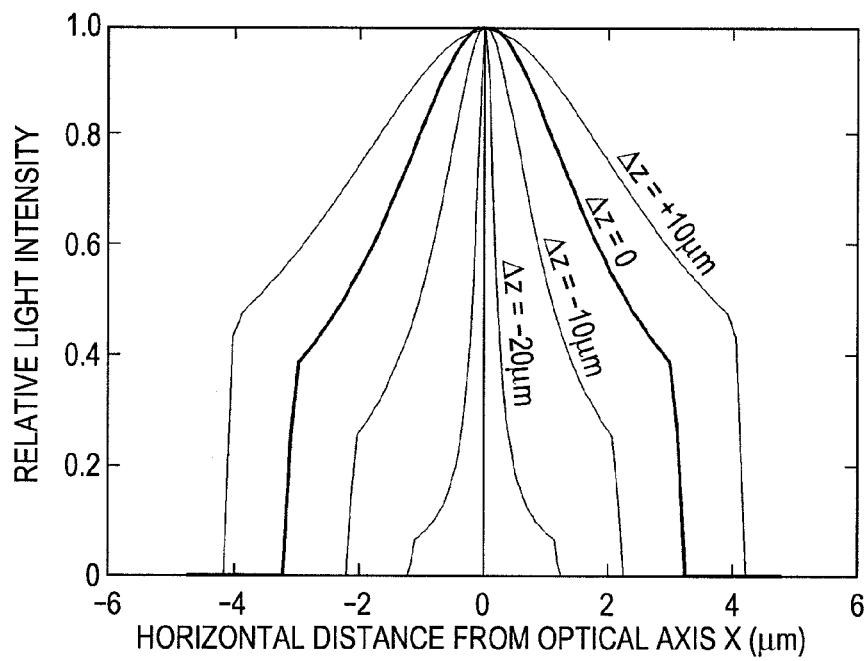
FIG. 18 is a graph showing illumination distribution in a horizontal direction in the vicinity of an aperture plane.
Figure 19:
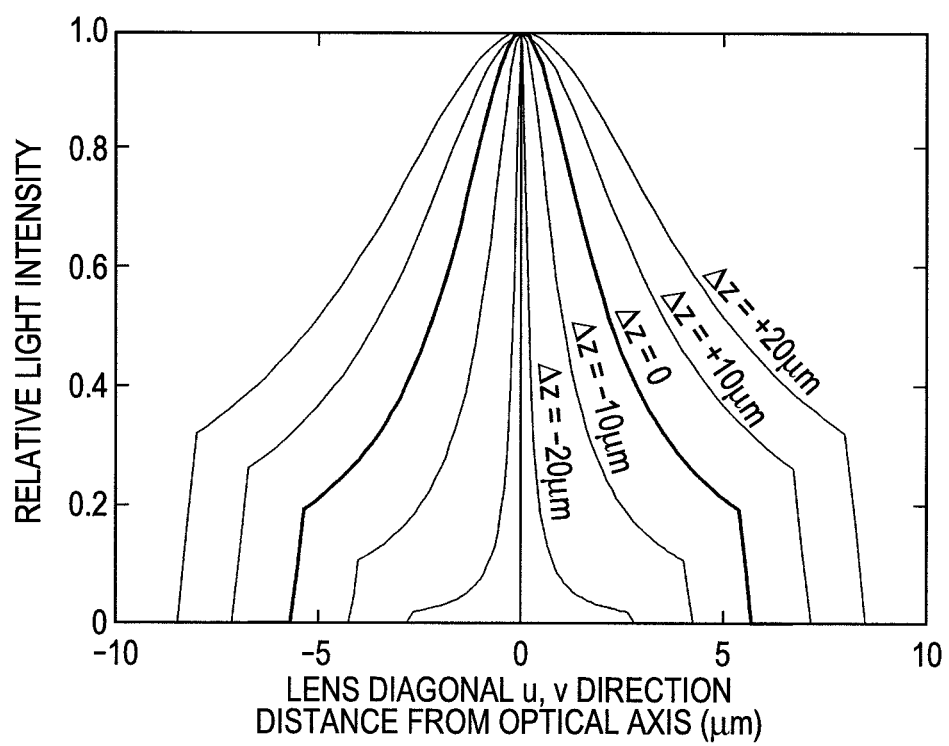
FIG. 19 is a graph showing illumination distribution in a diagonal direction in the vicinity of the aperture plane.

FIG. 18 shows the result of calculation of illumination distribution in horizontal and vertical directions (x, y directions) when there is no aperture. FIG. 19 shows the result of calculation of illuminance distribution in diagonal directions (u, v directions) when there is no aperture. These figures show illuminance distribution in the aperture plane position and its front and back positions of $\Delta Z = \pm 10$ μm, and $\pm 20$ μm. It is understood from these figures that the illuminance distribution on the aperture plane steeply drops from about 40% of the peak value to 0% and the width of the illuminance distribution with respect to the change in the aperture plane position is steeply changed.

In the aperture plane position, illuminance diameter of 20% of the peak value in the x and y directions is about 6 μm, and in the diagonal u and v directions, about 12 μm. In the designed optical system, the diameter of the aperture opening is assumed to be about 6 to 12 μm, and this opening has a diameter about the same as the diameter exposed by irradiation of collimated light beam on the lens array. Further, it is understood from these figures that even with an error about ±5 μm of the aperture plane position in the optical axis, an about 1 μm error of illuminance diameter of 20% of the peak value occurs. Accordingly, the thickness of the respective lens substrates requires precision of this level.

Figure 20:
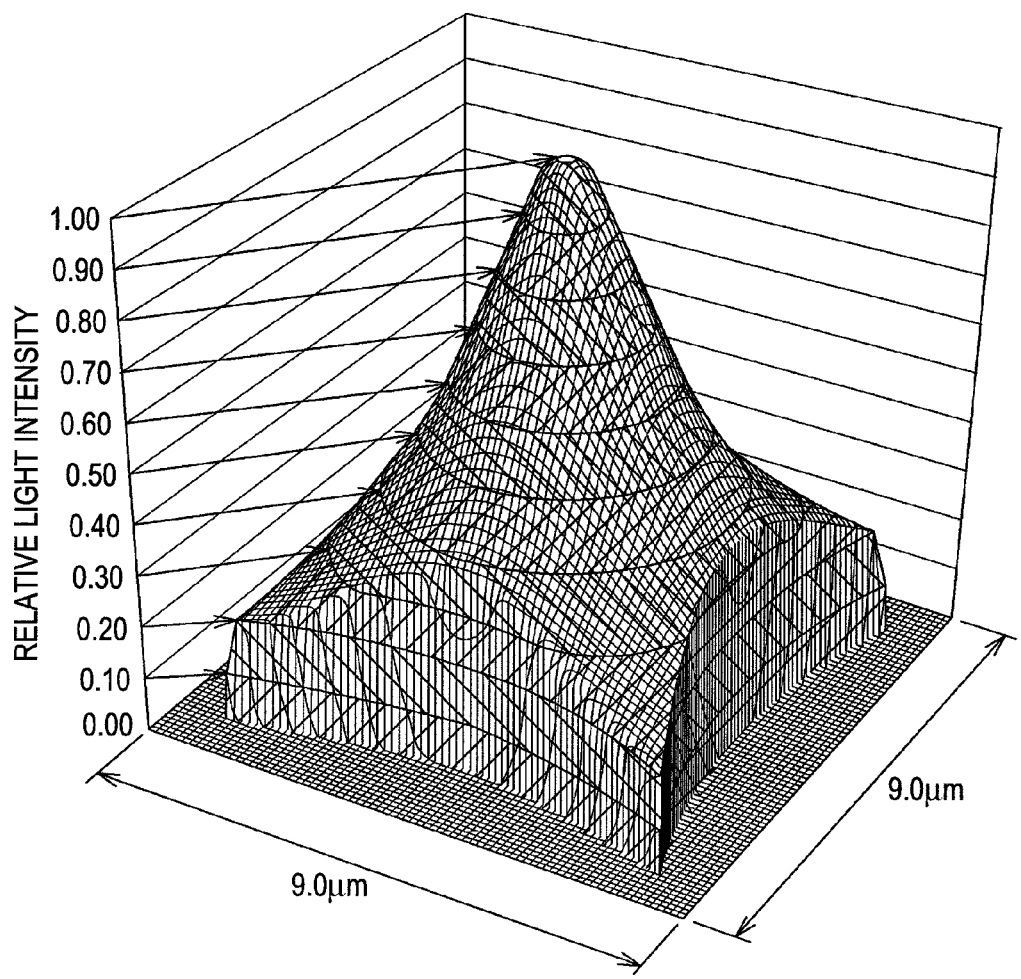
FIG. 20 is a bird's eye view showing illumination distribution on the aperture plane.
Figure 21:
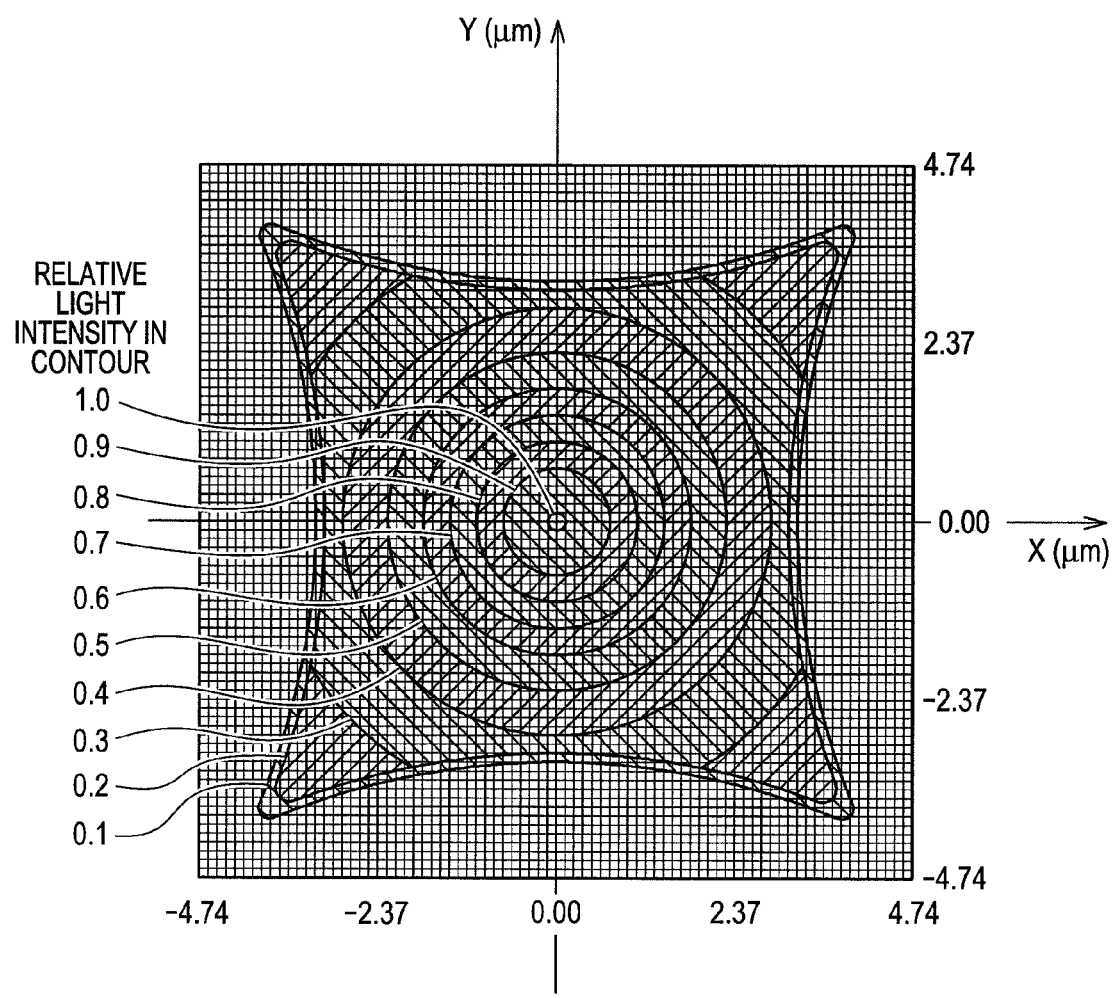
FIG. 21 is a contour map showing illumination distribution on a aperture plane.

FIGS. 20 and 21 show the illuminance distribution on the aperture plane with a bird's eye view and a contour map. It is understood from these figures that the range of exposure can be changed from e.g. 10% to 70% of peak illuminance contour by changing exposure time. For example, when parts with illuminance equal to or higher than 40% are left, the aperture opening is approximately circular and the diameter is about 6 μm. When parts with illuminance equal to or higher than 10% are left, the aperture opening has a pincushion rectangular shape and the diameter is 6.5 μm in the horizontal and vertical directions and 11 μm in the diagonal directions. The diameter of the opening can be adjusted within a certain range in accordance with exposure time.

As described above, the present invention provides an easily manufacturable light focusing/shielding array plate, thus contributes to practical use of image sensor advantageous for downsizing and thinning of a finger vein authentication apparatus.

Figure 22:
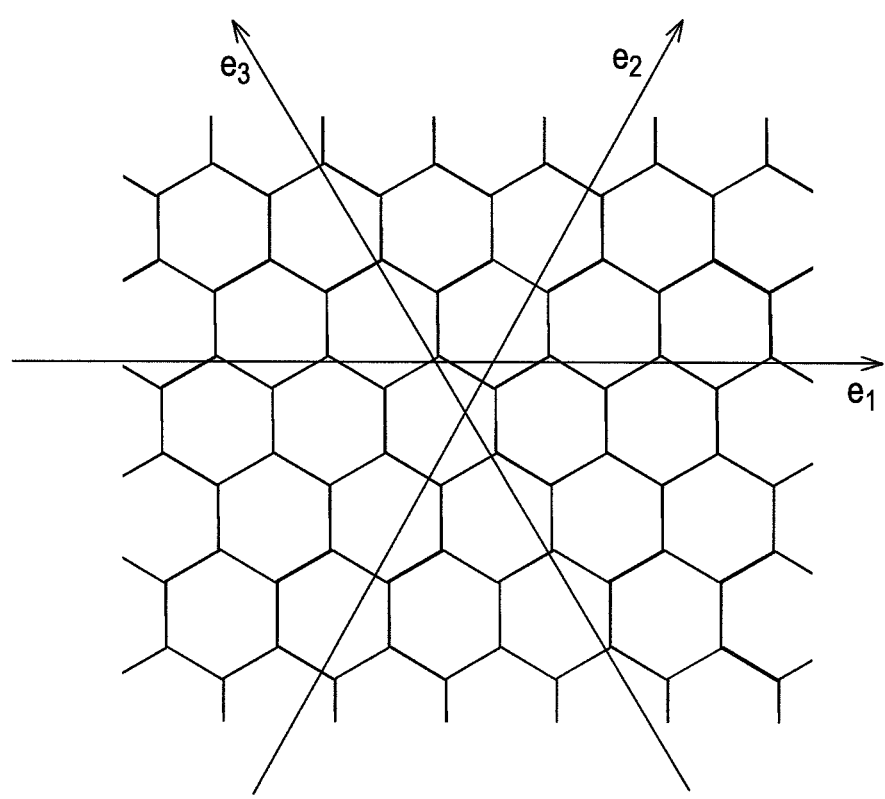
FIG. 22 illustrates another example of the arrangement of the pre-focus lens array.

FIG. 22 illustrates the arrangement of the pre-focus lens array in another embodiment of the present invention. The pre-focus lens is not a dense rectangular array but a dense hexagonal array, and in correspondence with the shape, the arrangement of the light detection devices of the image sensor is a delta array. In the ordinary rectangular array, translation in the x and y directions is repeated at the same periods and the resolution in the x and y directions is the same. However, the translation in the diagonal directions is repeated at $\sqrt{2}$ times periods and the resolution in these directions is lower. However, in this delta array, the resolution of the image sensor is equal in three directions $e_1$, $e_2$ and $e_3$ shown in FIG. 22, and it is advantageous to ensure resolution isotropy.

What is claimed is:

1. An imaging apparatus having a substrate where a plurality of light detection devices are arrayed and a light focusing/shielding device,
    wherein the light focusing/shielding device has a first lens array, a second lens array, and an aperture array between the first lens array and the second lens array,
    wherein the first lens array exists on an object side while the second lens array exists on the light detection device side,
    wherein the first lens array has a plurality of curved lens surfaces which are densely arrayed without a gap therebetween so as not to expose a flat part, and
    wherein the second lens array has a plurality of curved line surfaces which are spaced from one periphery so as to a flat part therebetween.

2. The imaging apparatus according to claim 1, wherein in the first lens array, the plurality of curved surfaces form micro lenses.

3. The imaging apparatus according to claim 2, wherein the micro lenses in the first lens array are arranged in a dense rectangular or dense hexagonal array.

4. The imaging apparatus according to claim 1, wherein in the second lens array, the plurality of curved surfaces form micro lenses which are aspherical surface lenses.

5. An imaging apparatus having a substrate where a plurality of light detection devices are arrayed and a light focusing/shielding device,
    wherein the light focusing/shielding device has a first lens array, a second lens array, and an aperture array between the first lens array and the second lens array,
    wherein the first lens array exists on an object side while the second lens array exists on the light detection device side,
    wherein the first lens array has a plurality of curved lens surfaces which are densely arrayed without a gap therebetween so as not to expose a flat part,
    wherein the second lens array has a plurality of curved line surfaces which are spaced from one periphery so as to a flat part therebetween, and
    further wherein a light beam emitted from one point of the object is focused with the first lens array in the vicinity of an aperture opening of the aperture array, passed through the aperture opening and diverged, and further, focused on the light detection device by an effect of the second lens array.

6. A method of manufacturing light focusing/shielding device where a first lens array is formed on a first substrate, a second lens array is formed on a second substrate, and an aperture array is held between the first substrate and the second substrate,
    wherein in the aperture array, openings of the aperture array are formed by using the first lens array as an exposure mask,
    wherein the first lens array has a plurality of curved lens surfaces which are densely arrayed without a gap therebetween so as not to expose a flat part, and
    wherein the second lens array has a plurality of curved line surfaces which are spaced from one periphery so as to a flat part therebetween.

7. The method of manufacturing light focusing/shielding device according to claim 6, wherein the first substrate and the second substrate are attached by using ultraviolet curing resin.

* * * * *